United States Patent [19]

Gravisse

[11] 4,324,946
[45] Apr. 13, 1982

[54] SOLAR RADIATION CONCENTRATOR

[76] Inventor: Philippe Gravisse, 18-20, rue de Presles, 75015 Paris, France

[21] Appl. No.: 177,748

[22] PCT Filed: Mar. 9, 1978

[86] PCT No.: PCT/FR79/00023
§ 371 Date: Nov. 9, 1979
§ 102(e) Date: Nov. 9, 1979

[87] PCT Pub. No.: WO79/00731
PCT Pub. Date: Oct. 4, 1979

[30] Foreign Application Priority Data

Mar. 9, 1978 [FR] France .............................. 78 06850

[51] Int. Cl.$^3$ ............................................. H01L 31/04
[52] U.S. Cl. ..................................... 136/247; 136/248; 136/257
[58] Field of Search ....................... 136/247, 257, 248

[56] References Cited

U.S. PATENT DOCUMENTS

| 4,110,123 | 8/1978 | Goetzberger et al. | 136/247 |
| 4,127,425 | 11/1978 | Chambers | 136/247 |
| 4,130,445 | 12/1978 | Blieden | 136/247 |
| 4,149,902 | 4/1979 | Mauer et al. | 136/247 |
| 4,184,895 | 1/1980 | Oster, Jr. | 136/247 |
| 4,190,465 | 2/1980 | Boling | 136/247 |
| 4,246,042 | 1/1981 | Knasel | 136/246 |

Primary Examiner—Aaron Weisstuch
Attorney, Agent, or Firm—Cushman, Darby & Cushman

[57] ABSTRACT

A luminescent solar radiation concentrator is disclosed. Incident radiation of flux $\phi_1$, and wavelength $\lambda_1$, impinges enclosure wall $V_1$ having a double index of refraction $n_1$, $n_2$ (where $n_2 > n_1$) and then is absorbed by cascade fluorescent concentrator/converter CL, which isotropically re-emits fluorescent radiation at wavelength $\lambda_2$ and flux $\phi_2$ (where $\lambda_2 > \lambda_1$, and $\phi_2 > \phi_1$) which then is absorbed by a solar photovoltaic cell. The double index of refraction wall prevents escape of fluorescence radiation from the enclosure.

10 Claims, 11 Drawing Figures

SOLAR RADIATION CONCENTRATOR

The present invention relates to a solar radiation concentrator, where radiation traverses a matrix in which are located substances functioning as a light cascade capable of absorbing energy in a range of wavelengths and to reemit it in a field of greater wavelengths corresponding to the optimum sensitivity zone of a solar photovoltaic cells on which the radiation arrives, the useful energy of which is thus amplified, where the said matrix is located in an enclosure, at least a part of which, in which said radiation penetrates before traversing said matrix, is formed of a substance having a first index of refraction on the exterior side of the enclosure, and a second index of refraction on the side of said matrix, said second index being as high as possible in relation to the first index, the remainder of said enclosure being opaque to said radiation reaching the said photovoltaic cell or to said photovoltaic cells located also in said enclosure.

More precisely, within the frame of the present invention, amplification of said energy is obtained by using a light cascade. The latter consists of substances capable of collecting energy in a given wavelength an to reemit it in a greater wavelength; such a cascade is the object of U.S. Pat. Nos. 3,912,931 and 4,088,508.

U.S. Pat. No. 3,912,931 describes a photovoltaic apparatus formed by a photovoltaic cell of the diode type having a junction of large surface area, coated with a plurality of layers arranged on top of each other and formed of a material transparent to the spectrum of sensitivity of the photovoltaic cell, the said material being preferably a resin other than silicones; this apparatus being particularly characterized in that each layer contains an aromatic hydrocarbon adapted to recover the energy coming from the preceding layer and to transmit same to the next layer, the photovoltaic cell thus receiving cumulatively the energies of the various layers.

The solar radiation amplifying apparatus described in U.S. Pat. No. 4,088,508 is adaptable to a photocell or other collector which receives the energy coming from weak wavelengths by means of a plurality of aromatic hydrocarbons or other luminescent substances yielding a high output functioning in cascade. The apparatus of U.S. Pat. No. 4,088,508 is also characterized in that a monolayer matrix is placed on the photocell or the collector, the monolayer matrix being made of a synthetic material in which the various hydrocarbons or other high output luminescent substances are dispersed in a homogeneous manner, the synthetic material being chosen in such a way that its threshold of absorption is located at a lower wavelength than the absorption zone of the hydrocarbon or other fluorescent substance placed at the beginning of the cascade, that is towards the shorter wavelengths.

In the two aforementioned patents, the matrix containing the various substances forming the light cascade had the function of physically supporting the said substances, as well as mechanical protection and encapsulation of junction diodes or other photovoltaic systems.

In the concentrator according to the present invention, the matrix, besides having this support function, has the function of guiding the radiation traversing the matrix in which are distributed the substances forming the light cascade. It has been discovered that each substance forming part of the said light cascade and absorbing in a range of wavelengths $\lambda 1$ reemits in a range of wavelengths $\lambda 2$, with $\lambda 2 > \lambda 1$, this reemission being accomplished in all directions, that is, according to a solid angle of $4\pi$.

In order to get maximum benefit from this diffusion of radiation, the radiation concentrator according to the present invention has a very characteristic arrangement. Due to this arrangement, maximum energy is recovered which is treated in a manner so as to obtain maximum use by the solar photovoltaic cell, whence flows a particularly high useful luminous flux for the latter.

In the following, the invention is described in more detail with the help of drawings illustrating several embodiments.

Figure 1:
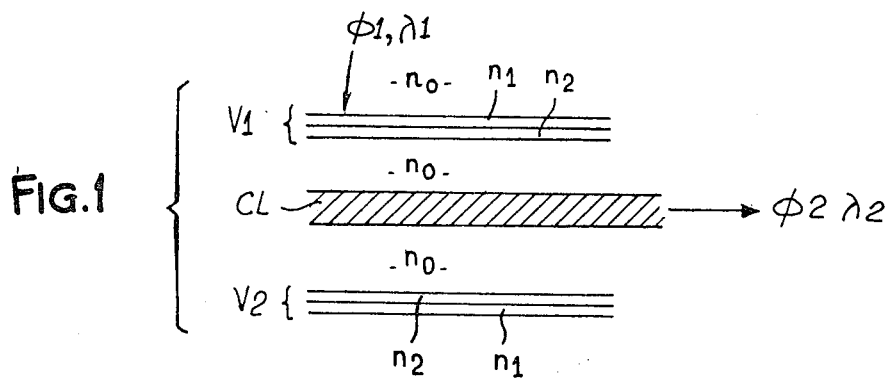
FIG. 1 is a schematic view of the principle for the functioning of the apparatus according to an embodiment of the invention.

Referring now to FIG. 1, it will be noted that the following is the principle for the functioning of the apparatus.

Radiation of intensity $\phi 1$ of wavelength $\lambda 1$, which is directed radiation, arrives to strike the wall $V_1$ of an enclosure at the interior of which light cascade CL is located; this wall $V_1$ has a double index of refraction, that is an index $n_1$ for the exterior side of said enclosure, and an index $n_2$ for the interior side of the enclosure. In a general way, an index $n_0$, corresponding to the atmosphere prevails at the interior and at the exterior of said enclosure. The light cascade in the present description and in the claims must be understood as being a substance, solid or liquid, in which are scattered luminescent elements absorbing energy in the shorter wavelengths $\lambda 1$ and reemitting it at longer wavelengths $\lambda 2$ corresponding to the optimum spectral region of effectiveness of the photocell, not shown here, but located in relation to the light cascade, that is in the case of FIG. 1, perpendicularly to wall $V_1$.

Thus from radiation $\phi 1$ $\lambda 1$ having parallel rays, one proceeds to radiation $\phi 2$ $\lambda 2$, reemitted in an isotropic manner in all directions and therefore in an angle of $4\pi$. Since index $n_2$ is higher than index $n_1$, and preferably related to the latter by equation $n_1 = \sqrt{n_2}$, radiation $\phi 2$ $\lambda 2$ will not practically be able to retraverse the wall $V_1$, thus forming a concentration of energy of intensity $\phi 2$ at the interior of the enclosure. Wall $V_2$, identical to $V_1$, can advantageously be placed on the other side of the light cascade.

The sides $V_1$ and $V_2$ can be made of ordinary highly transparent glass with index of refraction $n_1 = 1.5$, provided with a thin layer of material of high index refraction $n_2$, 2.25 for instance. Moreover, the wall $V_1$ can be advantageously exteriorly covered with a layer of anti-reflection material of index $n'_1$, thus allowing for a maximum amount of radiation to penetrate within the enclosure. FIGS. 2 to 6 better illustrate the concentrator according to the invention, which presents a prismatic geometry, the height of each of the prisms being small in relation to the dimensions of the bases.

Figure 2:
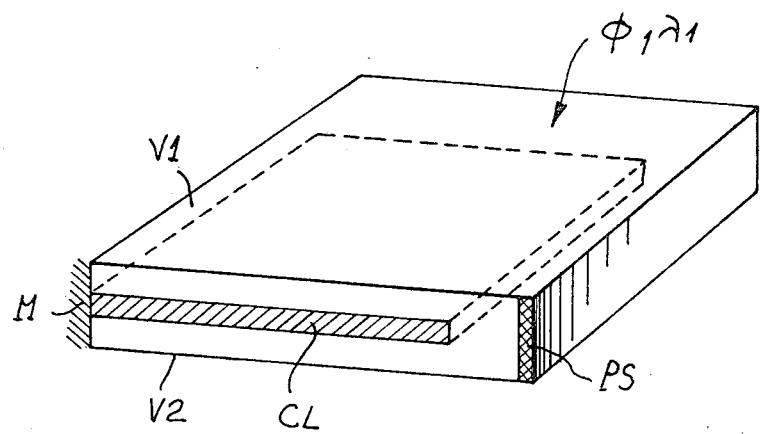
FIG. 2 is a perspective view of the apparatus of FIG. 1.

In FIG. 2, the said bases are rectangles, and are formed of walls $V_1$ and $V_2$; one of the lateral faces being formed of a mirror M, the opposite face comprising one or several photovoltaic cells arranged in opposing relation to said mirror M. The latter's reflecting face, which is turned towards the interior of the enclosure, increases the reflections at the interior of the enclosure and improves the yield of the photovoltaic cells; the two remaining lateral faces can be either walls of the type $V_1$ or $V_2$, or mirrors of the type M. Moreover, the light cascade CL here is solid, and abuts photovoltaic cells PS; it is also possible to separate the extremity of said light cascade from the photovoltaic cells, or to enlarge the latter in such a manner that its transverse section will correspond, in dimensions, to the photovoltaic cells PS.

Figure 3:
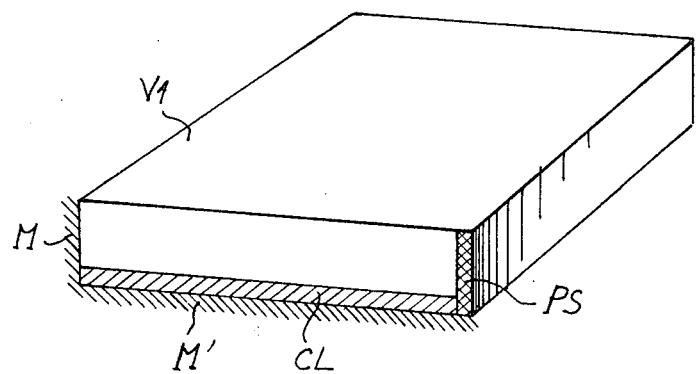
FIG. 3 is a modification of the embodiment of FIG. 2.

FIG. 3 is a modification of the concentrator of FIG. 2, and it will be noted that only one of the bases is formed of a wall having a double index of refraction (of the type $V_1$); the other base is formed of a mirror M' oriented in the same manner as mirror M, towards the interior of the enclosure. In the case of FIG. 3, the light cascade is joined to mirror M'. This latter characteristic is not essential.

Figure 4:
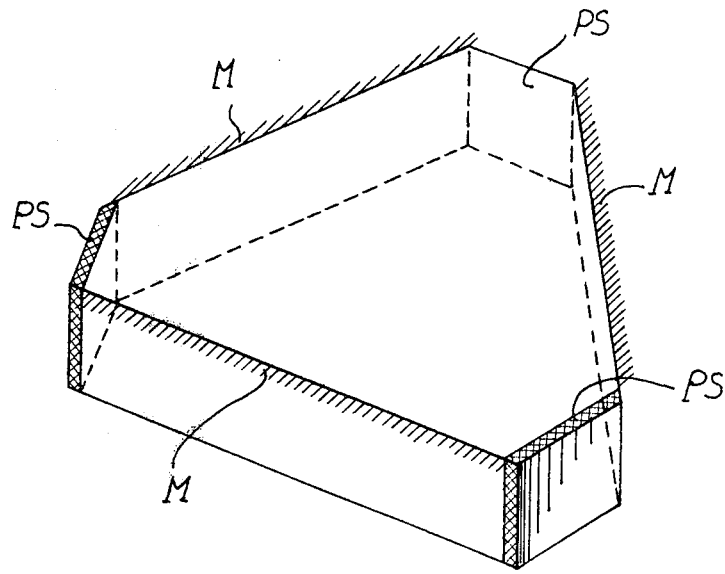
FIG. 4 is a second modification of the embodiment of FIG. 2.

FIG. 4 shows another modification where the bases are triangular, the three lateral faces being formed of mirrors M, and a photovoltaic cell PS being provided at each edge of the prism, in such a way that there is always a mirror M facing a photovoltaic cell PS. In the case of this figure, one of the bases is formed of a type $V_1$ wall, the other base being either of the $V_2$ type, or a mirror M' as previously described.

Another embodiment of the concentrator utilizes on the one hand the photovoltaic effect and on the other hand, the thermodynamic effect, by the joining of a thermodynamic loop (BTD) with circulation of a fluid which absorbs heat at the interior of the concentrator and removal of those calories in an exchanger E either to feed a heat pump, or to store the heat. This arrangement has the advantage of cooling the photopiles PS.

Figure 5:
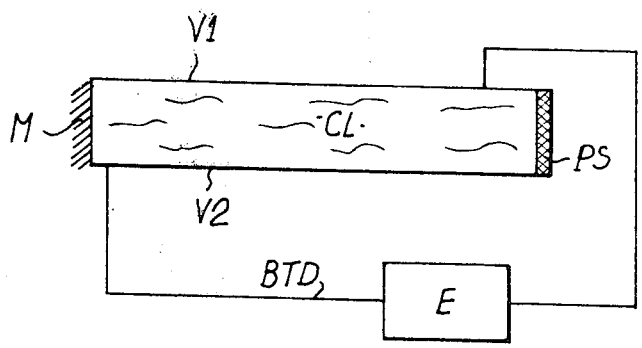
FIG. 5 is still another embodiment of the invention.

In FIG. 5, the said fluid is formed by the liquid matrix of light cascade CL which fills the internal volume of the enclosure, the geometry and characteristics of which are those of the concentrator shown in FIG. 2.

There is, however, reason for particular concern for the photovoltaic cell PS, the contact of which with light cascade CL can reveal certain disadvantages.

Figure 6:
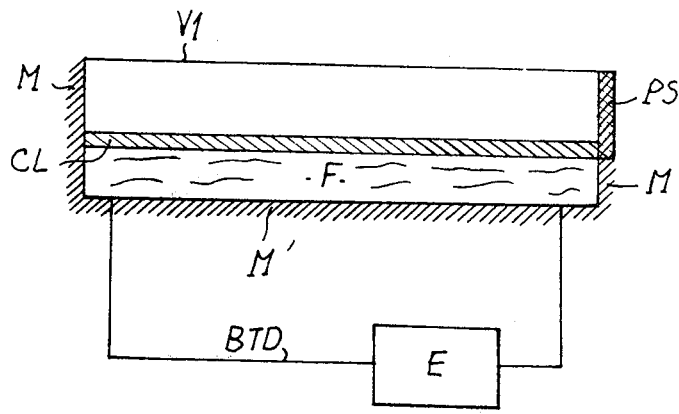
FIG. 6 is a modification of the embodiment of FIG. 5.

That is the reason why the modification illustrated in FIG. 6, where the concentrator is that of FIG. 3, has in addition to the thermodynamic loop BTD, a supplemental space where fluid F circulates, absorbing the calories as in the previous embodiment. In this embodiment light cascade CL is solid, and the photovoltaic cells PS is not in contact with fluid F, the portion of the lateral wall located under the photovoltaic cell, between the latter and the base formed of mirror M' being itself formed of a mirror M.

Thus, the concentrator according to the invention may be a photovoltaic apparatus or a thermophotovoltaic apparatus.

The concentrator such as above described, particularly that illustrated at FIG. 2, may have other purposes.

Such a concentrator can, for example, be used as glasswork. The quantity of light penetrating the enclosure, although small because of the indices $n_1$ and $n_2$ of walls $V_1$ and $V_2$, is however sufficient to assure an amount of light entering a building comprising such a concentrator as glasswork. In addition, the latter being double glazed (sides $V_1$ and $V_2$), the conventional advantages of double glassworks (thermal and acoustic insulation, especially) would be obtained.

In other respects, some unquestionable advantages appear at the photovoltaic cells used in those concentrators. In the first place, the said photovoltaic cells can be, with equal current, reduced in number since the output of the present concentrator is improved in relation to simple conventional concentrators. Moreover, since the concentrators are intended to serve as external panels for buildings, the photopiles located on the lateral walls are protected.

That is the reason why when making such panels, concentrators having a geometry such as illustrated in FIGS. 2 to 6, that is, a flat prism, will preferably be used.

Another geometry may be used in another embodiment of the concentrator according to the invention.

Figure 7:
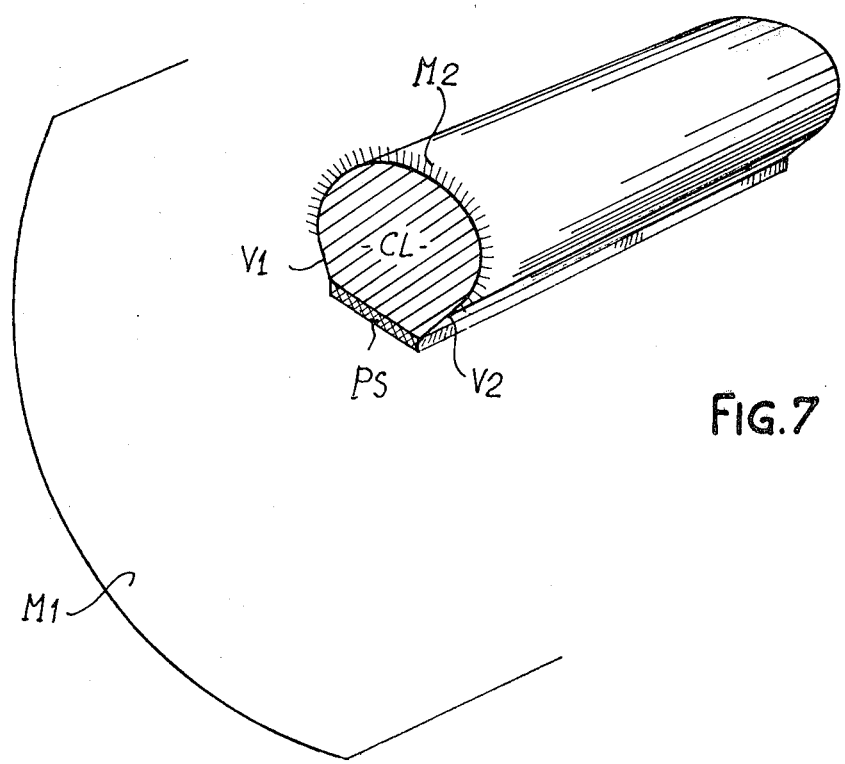
FIG. 7 illustrates a perspective view of still another embodiment of the invention.
Figure 8:
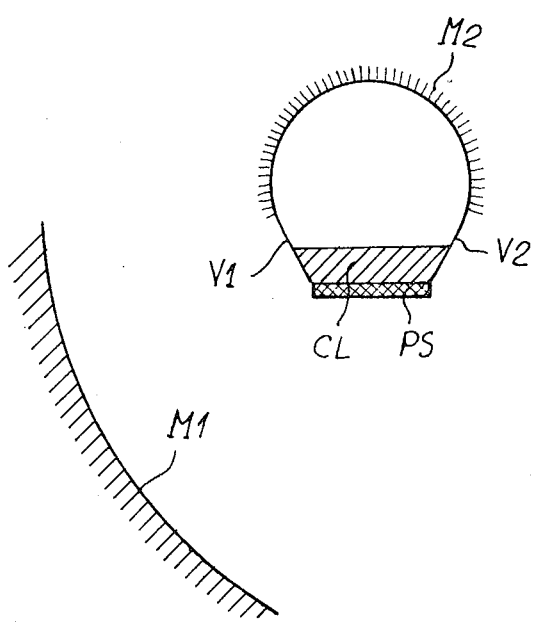
FIG. 8 is a cross-sectional of a modification of the embodiment of FIG. 7.

This geometry appears in FIGS. 7 to 11 where the enclosure is prismatic with a truncated circular portion, the transverse section of which being trapezoidal in geometry (FIGS. 7 and 8). Additionally, the transverse section can be circular (FIGS. 9 to 11), wherein the concentrator would then have the form of a tube, which in the case illustrated in FIGS. 7 to 11, is located along the linear focus of a parabolic mirror receiving solar radiation.

The concentrator illustrated in FIG. 7 shows a truncated circular transverse section.

In this embodiment, the small flat base is formed by an array of photovoltaic cells PS, the circular part and the large base of the trapezoidal transverse section is a mirror M2, the reflecting concavity of which is turned towards the photovoltaic cells. The portions connecting the small base to the circular part are the above-mentioned walls $V_1$ and $V_2$. Here the light cascade is solid and occupies all the internal space of the tube so defined.

FIG. 8 shows an identical geometry for the concentrator, the only difference being that the light cascade CL no longer occupies all the internal space of the tube, but only a portion thereof located precisely on the photovoltaic cells PS.

Figure 9:
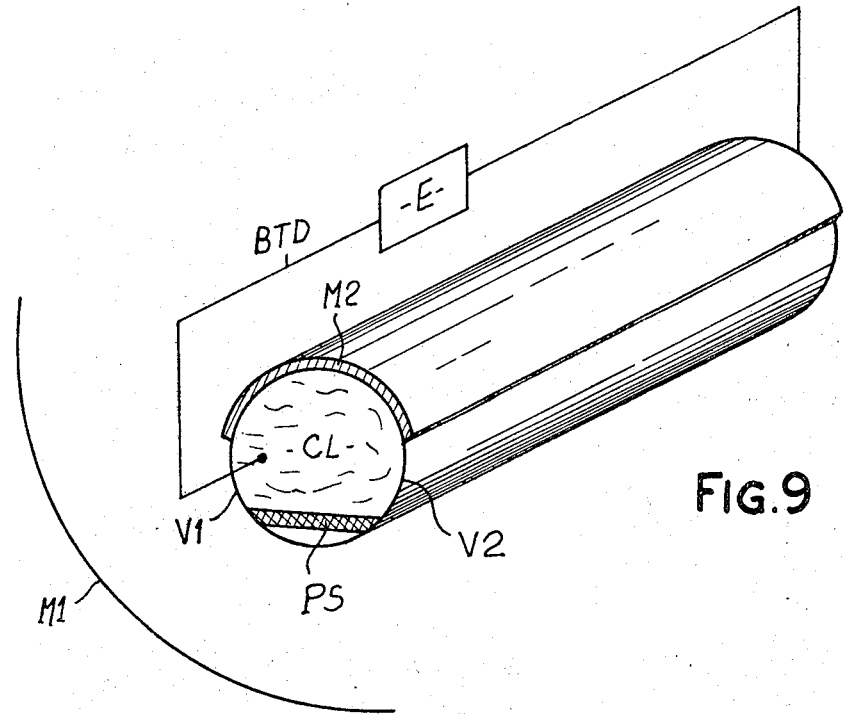
FIG. 9 is a perspective view of an embodiment of the invention.

Various modifications have been made in FIG. 9; thus it is seen that the tube is cylindrical with a circular section, the light cascade CL being liquid and forming the fluid discharging the heat outside of the concentrator. In return, alignment of the photovoltaic cells PS and concave mirrors M2 is always present and both are arranged in the same manner. The parts of the tube located between concave mirrors M2 and photovoltaic cells PS are shown in the form of two bands $V_1$ and $V_2$ formed of the substance having a double index of refraction.

Figure 10:
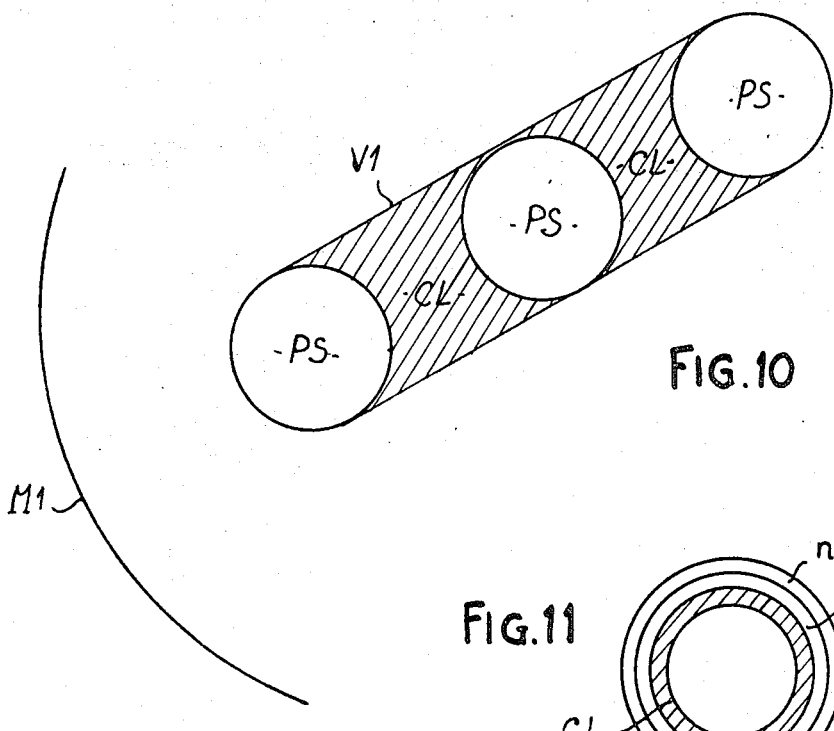
FIG. 10 is a perspective view of another embodiment according to the present invention.
Figure 11:
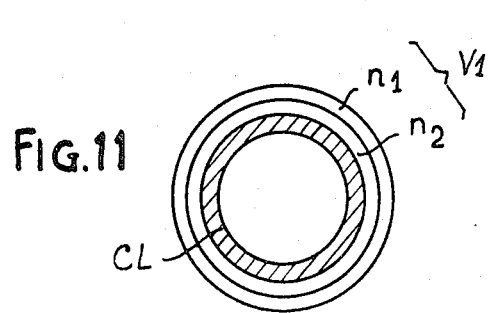
FIG. 11 is a sectional view of the apparatus of FIG. 10 in a particular embodiment of the invention.

FIG. 10 illustrates another mode of embodiment of the concentrator, where the enclosure is always cylindrical with a circular section, as in FIG. 9, but where the photovoltaic cells are arranged in a normal manner along the longitudinal axis of the cylinder, and turned towards the interior of the tube, mirror M2 having been deleted. In this figure, either a liquid light cascade with thermodynamic loop may be used, or a solid light cascade occupying all the internal space of the tube, or yet, as is the case shown at FIG. 11, a solid light cascade, as shown in the form of a layer disposed at the interior of the enclosure against the wall $V_1$, the interior of said tube being filled with air or with a rare or a common gas. Another modification consists in taking a tube with a double index $n_1$, $n_2$, the solid light cascade being in the form of a layer covering only the photovoltaic cells.

In addition to the advantages of the concentrator of FIGS. 2 to 6, the concentrator illustrated at FIGS. 7 to 11 has the following additional advantage: in a conventional apparatus there is a parabolic mirror, the photovoltaic cells being placed at the focus thereof; there follows a concentration of heat and a risk of deterioration of the photovoltaic cells being exposed to the image of the sun. This is not the case in the present invention where the light cascade acts as a wavelength converter of light according to $\phi 2$ $\lambda 2$, supplying only wavelengths to which the various photovoltaic cells are sensitive.

Whatever the mode of illustrated embodiment may be, one can always find an enclosure, at the interior of which is located the light cascade, said enclosure being made in whole or in part of a glass wall or the like having a double index of refraction. It is well understood that the present invention also covers the case of a solid light cascade CL covered with a transparent index $n_2$ coating, the latter being itself covered with a transparent index $n_1$ coating.

Similarly, the usable photovoltaic cells are essentially of the silicon, unijunction type, but in the present concentrator other solar batteries of the multijunction type of the CdS, GaAs type, or even the amorphous silicon type, may be used.

Moreover, the thermodynamic loop (BTD) may comprise an impervious reservoir located behind the solar photovoltaic cell PS and containing a heat exchange fluid cooling the said photovoltaic cell and feeding an exchanger E such as above mentioned.

I claim:

1. Combined solar radiation concentrator and photovoltaic converter, where incident radiation (intensity $\phi 1$, wavelength $\lambda 1$) traverses a solid matrix before arriving under the form (intensity $\phi 2$, wavelength $\lambda 2$) on at least one planar solar photovoltaic cell, said matrix being disposed at the interior of an enclosure at least a part of which, where said radiation penetrates before traversing the said matrix, is formed of a substance having a first index of refraction ($n_1$) on the exterior side of the enclosure, and a second index of refraction ($n_2$) on the interior side of the enclosure closest said matrix, said second index being substantially higher than said first index, the remainder of the said enclosure being opaque to radiation arriving said at least one photovoltaic cell also located in or forming part of said enclosure, characterized in that a plurality of substances functioning in cascade are distributed in an homogeneous manner in said matrix, the said substances absorbing and reemitting radiation the wavelength of which increases after re-emission by each one of the said substances, and the wavelength of the final radiation $\lambda 2$ corresponding to the optimum range of spectral sensitivity of the solar photovoltaic cells.

2. Concentrator/converter according to claim 1, wherein said enclosure has the form of a tube is located along the focus of a parabolic mirror.

3. Concentrator/converter according to claim 2, wherein the transverse section of the tube is trapezoidal, the small base being covered with small photovoltaic cells, the two lateral sides being formed on a substance having a double index of refraction, and the larger base being formed of a mirror.

4. Concentrator/converter according to claim 3, characterized in that the larger base is convex, the reflecting concavity being turned towards the photovoltaic cells and the parabolic mirror.

5. Concentrator/converter according to claim 2, characterized in that the transverse section of the tube is circular, the solar photovoltaic cells being aligned in a row along the length of the interior of said tube according an elongated concave mirror facing in opposing relation to said photopiles and said parabolic mirror and forming a part of the lateral wall of the said tube, the two remaining bands forming said tube disposed between said concave mirror and said photovoltaic cells being formed of the substance having a double index of refraction.

6. Concentrator/converter according to claim 2, wherein the transverse section of the tube is circular, the solar photovoltaic cells being arranged normal to the longitudinal axis of the said tube.

7. Concentrator/converter according to claim 1, where said enclosure has the form of a prism the height of which is low in relation to the dimensions of the bases, characterized in that the two bases are formed by the substance having a double index of refraction.

8. Concentrator/converter according to claim 7, characterized in that, the said bases being triangular, the three lateral faces are formed of mirrors the reflecting face of whch is turned towards the interior of the enclosure, the angles being occupied by solar potovoltaic cells.

9. Concentrator/converter according to claims 1, 2, 3, 4, 5, 6, 7 or 8 wherein said matrix occupies only part of the enclosure, and wherein said matrix is in the form of a layer placed in contact with the solar photovoltaic cells.

10. Concentrator/converter according to any one of claim 1 to 8, where the said matrix occupies only part of the enclosure, characterized in that the said matrix is in the form of a layer placed adjacent the substance having a double index of refraction, at the interior of the enclosure.

* * * * *